US 6,603,171 B2

(12) United States Patent
Grossi et al.

(10) Patent No.: US 6,603,171 B2
(45) Date of Patent: Aug. 5, 2003

(54) ELECTRONIC DEVICES WITH NONVOLATILE MEMORY CELLS OF REDUCED DIMENSIONS (75) Inventors: Alessandro Grossi, Milan (IT); Cesare Clementi, Busto Arsizio (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 10/225,315

(22) Filed: Aug. 20, 2002

(65) Prior Publication Data

US 2003/0064558 A1 Apr. 3, 2003

Related U.S. Application Data (62) Division of application No. 09/718,971, filed on Nov. 22, 2000, now Pat. No. 6,509,222.

(30) Foreign Application Priority Data

Nov. 26, 1999 (EP) ............................................. 99830735

(51) Int. Cl.⁷ ............................................. H01L 27/148
(52) U.S. Cl. ....................... 257/326; 257/314; 438/201; 438/257; 438/258; 438/266
(58) Field of Search ................. 257/314, 326; 438/201, 257, 258, 266

(56) References Cited

U.S. PATENT DOCUMENTS

| | | | |
|---|---|---|---|
| 5,200,350 A | 4/1993 | Gill et al. | 437/43 |
| 5,282,160 A | 1/1994 | Yamagata | 365/185 |
| 5,741,719 A | 4/1998 | Kim | 437/43 |
| 5,815,433 A | 9/1998 | Takeuchi | 365/182 |
| 6,013,551 A | 1/2000 | Chen et al. | 438/264 |
| 6,300,195 B1 | 10/2001 | Pozzoni et al. | 438/257 |

FOREIGN PATENT DOCUMENTS

| | | |
|---|---|---|
| DE | 41 13 325 A1 | 10/1991 |
| WO | 94/05037 | 3/1994 |

Primary Examiner—Richard Elms
Assistant Examiner—Christian D. Wilson
(74) Attorney, Agent, or Firm—Lisa K. Jorgenson; E. Russell Tarleton; Seed IP Law Group PLLC (57) ABSTRACT A process for the manufacturing of electronic devices, including memory cells, involving forming, on a substrate of semiconductor material, multilayer stacks including a floating gate region, an intermediate dielectric region, and a control gate region; forming a protective layer extending on top of the substrate and between the multilayer stacks and having a height at least equal to the multilayer stacks. The step of forming multilayer stacks includes the step of defining the control gate region on all sides so that each control gate region is completely separate from adjacent control gate regions. The protective layer isolates the multilayer stacks from each other at the sides. Word lines of metal extend above the protective layer and are in electrical contact with the gate regions.

5 Claims, 9 Drawing Sheets

FIG. 24 ations of this form
ELECTRONIC DEVICES WITH NONVOLATILE MEMORY CELLS OF REDUCED DIMENSIONS This application is a Divisional of pending U.S. patent application Ser. No. 09/718,971, filed Nov. 22, 2000 now U.S. Pat. No. 6,509,222.

TECHNICAL FIELD

The present invention regards a process for manufacturing electronic devices comprising nonvolatile memory cells of reduced dimensions.

BACKGROUND OF THE INVENTION

Devices using nonvolatile memories, for example of the EPROM type or EEPROM type, such as smart cards, complex microcontrollers and mass storage devices which require programmability of the individual byte, call for increasingly higher levels of performance and reliability.

In practice, from the technological standpoint, this means that it is necessary to get high performances (i.e., increasingly thinner tunnel oxides, ever more reduced programming voltages, increasingly greater cell current-driving capability, etc.) to coexist with an extremely high reliability: one hundred thousand programming cycles and retention of the stored charge for at least ten years are by now considered the minimum requisites for accepting these products on the market.

Therefore, it is necessary to develop new manufacturing processes and new geometries that are able to eliminate some of the critical aspects typical of memories, thus increasing their intrinsic reliability without reducing their performance, both for "embedded" applications (i.e., ones in which the memory cells are associated to electronic devices that perform preset functions) and for stand-alone applications (i.e., ones in which the device is merely a nonvolatile memory).

In particular, the reduction in the dimensions of memory devices entails severe constraints as regards formation of contacts and alignment of contacts with the drain regions.

For reducing the dimensions of memory devices, alternate metal ground (AMG) devices are known, wherein the diffused source lines and diffused drain lines are parallel, and the contacts are formed outside the area of the memory cells.

However, these memory devices have the problem that the word lines, formed by non-planar polysilicon strips defining the control gate regions of the memory cells, undergo sharp changes in direction in reduced spaces (corresponding to the width of the diffused source and drain lines). In addition, the polysilicon strips are not well insulated from the substrate because of the reduced thickness of the tunnel layer.

SUMMARY OF THE INVENTION

The present invention provides a manufacturing process that reduces the constraints with respect to the formation and alignment of the contacts of the memory cells, and hence reduces the dimensions of the memory cells without reducing their performance.

According to the present invention, a process for manufacturing electronic devices comprising nonvolatile memory cells, and an electronic device comprising nonvolatile memory cells are provided.

In accordance with one embodiment of the invention, a process for manufacturing electronic devices including memory cells is disclosed, including forming stacks on a substrate of semiconductor material, the stacks including a floating gate region of semiconductor material, an intermediate dielectric region, and a control gate region of semiconductor material; forming a protective layer of insulating material extending on top of the substrate and between the stacks, the protective layer having a height at least equal to that of the stacks; wherein forming the stack structures includes defining the control gate region in two non-parallel directions so that each control gate region is separate and electrically insulated with respect to the control gate regions belonging to adjacent stack structures; and such that, during the forming of the protective layer, the stack structures are completely isolated with respect to one another in the two directions, and further including forming word lines of conductive material that extend above the protective layer and that are in electrical contact with the control gate regions.

In accordance with another embodiment of the invention, a process for manufacturing electronic devices is disclosed that includes forming first insulating regions and second insulating regions in a first area and, respectively, in a second area separate from the first area, of a substrate of semiconductor material, the process including forming a hard mask having openings on the first area; forming trenches in the second area; depositing an insulating material layer filling the trenches and the openings; and selectively removing the insulating material layer on top of the hard mask and on top of the trenches so as to simultaneously form the first insulating regions and the second insulating regions; the first insulating regions in the first area having a different height from the second insulating regions in the second area.

In accordance with yet another aspect of the present invention, an electronic device is disclosed that includes a substrate of semiconductor material; memory cells, each including a stack on top of the substrate, each of the stacks comprising a floating gate region of semiconductor material, an intermediate dielectric region, and a control gate region of semiconductor material; and a protective layer extending on top of the substrate and between the stack structures, the protective layer having a height at least equal to that of the stack structures and word lines of conductive material extending on top of the insulating material layer; and further wherein the control gate region is physically separated from the control gate regions belonging to adjacent stack structures by the protective layer, and including word lines extending on top of the control gate regions and in electrical contact with the control gate regions.

In accordance with still yet another embodiment of the present invention, a process for manufacturing electronic devices on a substrate of semiconductor material is disclosed. This process includes forming a control gate region in two nonparallel directions on a stack formed of an intermediate dielectric region on top of a floating gate region; surrounding each stack with a protective layer of nonconductive material; and forming a word line of conducting material above the protective layer and in electrical contact with the control gate region.

BRIEF DESCRIPTION OF THE DRAWINGS

For a better understanding of the present invention, a preferred embodiment thereof will now be described, as a non-limiting example, with reference to the attached drawings, wherein.

DETAILED DESCRIPTION OF THE INVENTION

The following description regards an embodiment of a device containing EPROM memory cells and transistors. The invention is not, however, limited to EPROM memories, but may be applied to memories of a different type, such as flash-EEPROM and EEPROM memories, possibly with suitable adaptations to take into account the specific geometries of the memory cells.

In a per se known manner, the memory cells form a memory array and are formed in a wafer part, hereinafter also referred to as matrix area 15, while circuit transistors are formed in a wafer, hereinafter also referred to as circuitry area 16.

Figure 1:
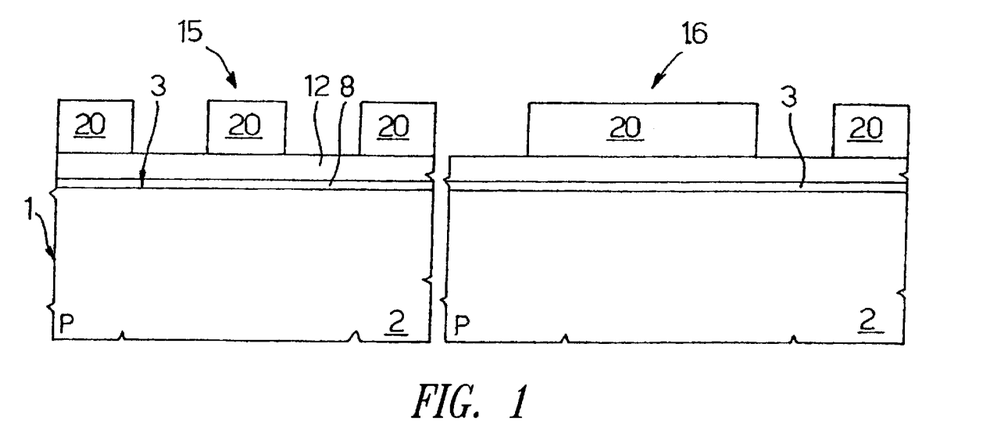
FIG. 1 shows a cross-section through a wafer in an initial step of the manufacturing process according to the invention.

In FIG. 1, a wafer 1 formed by a monocrystalline silicon substrate 2, here of a P type, has undergone the steps of definition of the active areas.

In detail, on the surface 3 of the substrate 2 is formed a double layer of silicon oxide 8 and silicon nitride 12.

The matrix area 15 defines a grid, partly shown in FIG. 1; FIG. 1 moreover shows a part of the circuitry area 15 in which LDD-type NMOS transistors will be formed, in the considered example.

Further areas may be provided for further electronic components, not shown in the drawings.

In the matrix area 15, strips of the wafer 1 which are parallel to one another and perpendicular to the plane shown in FIG. 1, are covered by a first isolation mask 20 of resist.

In addition, in the circuitry area 16, regions corresponding to the active areas are covered by the first isolation mask 20.

Figure 2:
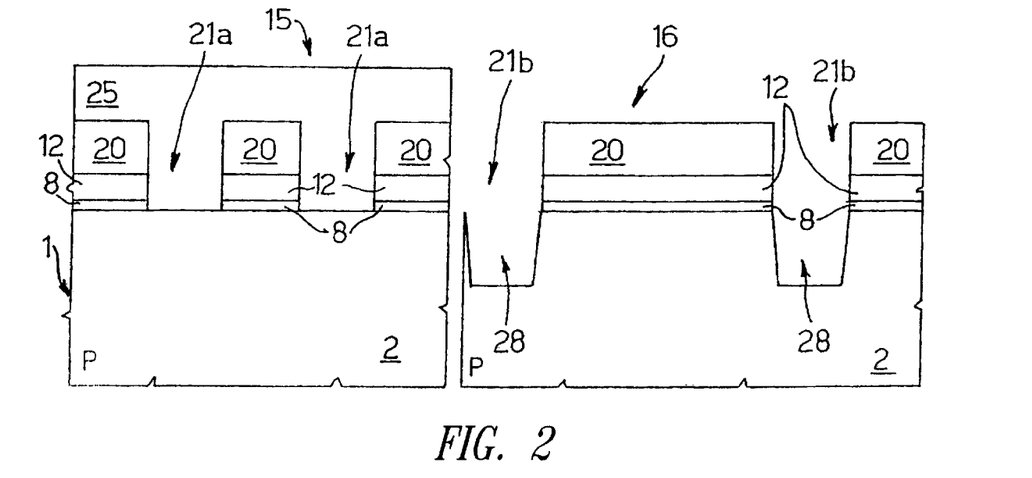
FIGS. 2–8 show cross-sections similar to that of FIG. 1, in subsequent manufacturing steps.

As shown in FIG. 2, by means of the first isolation mask 20 the nitride layer 12 and oxide layer 8 are anisotropically etched. The remaining portions of the nitride layer 12 and oxide layer 8 form a hard mask having elongated openings 21a in the form of strips in the matrix area 15 and openings 21b in the circuitry area 16.

Next, a second isolation mask 25 of resist is formed and entirely covers the matrix area 15, leaving the circuitry area 16 uncovered.

Subsequently, the substrate 2 is etched at the openings 21b in the circuitry area 16 where uncovered by the first isolation mask 20 and by the hard mask 12, 8, so as to form trenches 28 (FIG. 2). Then the first isolation mask 20 and second isolation mask 25 are removed, and the free surface of the substrate 2 is cleaned from any impurities.

Alternatively, it is possible to etch the hard mask 12 and then remove the first isolation mask 20, before depositing the second isolation mask 25. Next, the substrate 2 is etched in the circuitry area 16 where the latter is not protected by the hard mask 12, 8, so as to form trenches 28.

Subsequently, possibly a first thermal oxidation is carried out at a high temperature, and then a second oxidation is performed for relieving the possible stress induced in the wafer 1 when the trenches 28 are formed.

Figure 3:
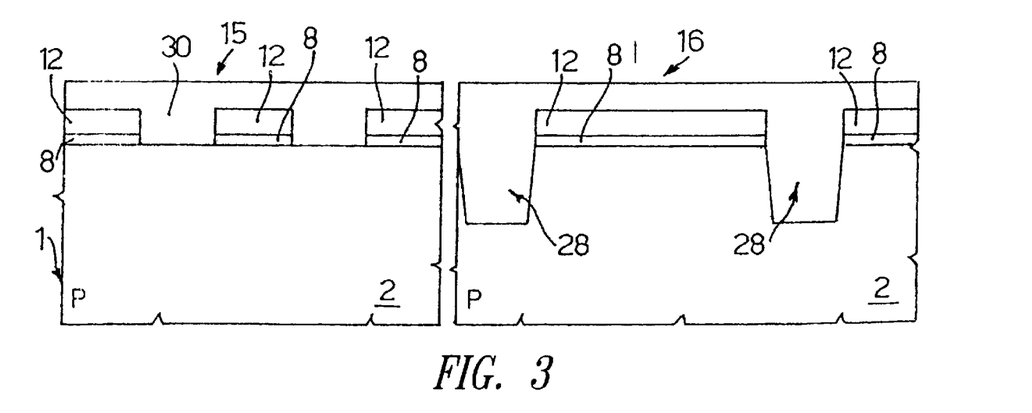

Subsequently, for example using CVD techniques, an oxide layer 30 is deposited to fill the trenches 28 and openings 21a, as shown in FIG. 3, until the nitride portions 12 are also covered. The oxide layer 30 can be formed also from a multilayer.

Subsequently, the wafer 1 is planarized using the CMP technique. During this step, the oxide layer 30 is removed everywhere above the level of the nitride portions 12. Next, also the nitride portions 12 and the portions of the oxide layer 30 comprised between them are partially removed differently in the circuitry area 16 and in the matrix area 15. In fact, since the nitride portions 12 are set further apart in the circuitry area 16 than in the matrix area 15, the height of the remaining nitride portions 12 and oxide portions 30 is smaller in the circuitry area 16 than in the matrix area 15.

Figure 4:
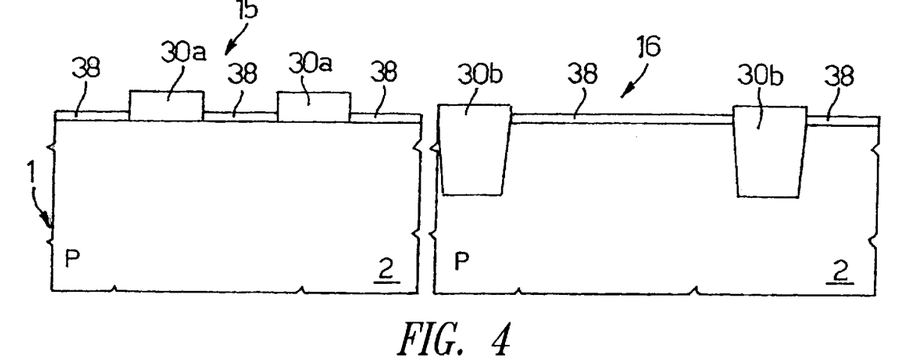

Using a further resist mask (not shown) which covers the matrix area 15, it is optionally possible to further partially remove the oxide layer 30 in the circuitry area 16, to increase the difference in height with respect to the matrix area 15. Consequently, first field oxide regions 30a are formed in the matrix area 15, and second field oxide regions 30b are formed in the circuitry area 16; the second field oxide regions 30b having a smaller height than the first field oxide regions 30a, as shown in FIG. 4. The first field oxide regions 30a have the shape of strips extending perpendicularly with respect to the drawing, corresponding to the shape of the openings 21a of FIG. 2.

Subsequently, the nitride portions 12 are removed completely using phosphoric acid at a high temperature, and a sacrificial oxide layer 38 is grown either after the oxide portions 8 have been removed or directly on the oxide portions 8 themselves to protect the substrate 2 during the subsequent steps, as shown in FIG. 4.

A threshold implant is then carried out to modify the voltage threshold of the transistors. The sacrificial oxide layer 38 is removed in the matrix area 15, and a tunnel oxide layer 39 is grown. A first polysilicon layer (poly1 layer 40) is deposited, which is to form the floating gate regions of the memory cells in the matrix area 15, and an interpoly dielectric layer 41 is formed, for example comprising a triple layer of silicon oxide/silicon nitride/silicon oxide (ONO layer).

Figure 5:
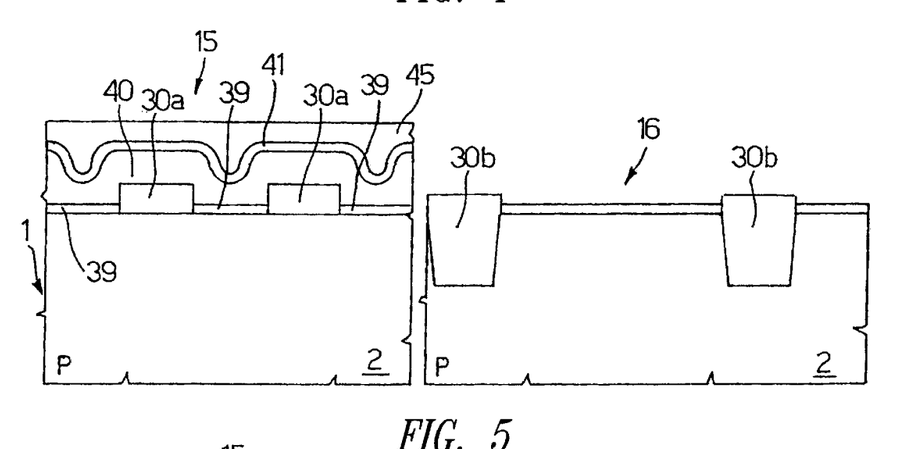

Subsequently, a mask 45 is formed and covers the matrix area 15. Then the interpoly dielectric layer 41, the poly1 layer 40 and the tunnel oxide layer 39 are removed from the circuitry area 16 together with the sacrificial oxide layer 38. In this way, the structure shown in FIG. 5 is obtained.

Figure 6:
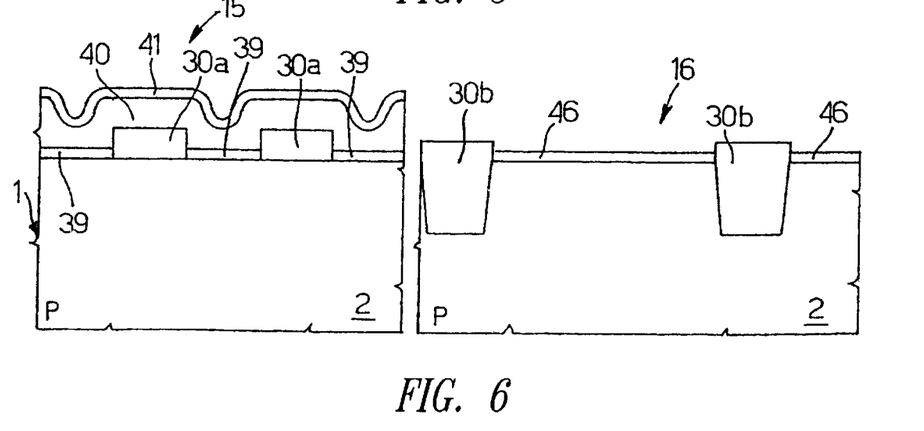
Figure 7:
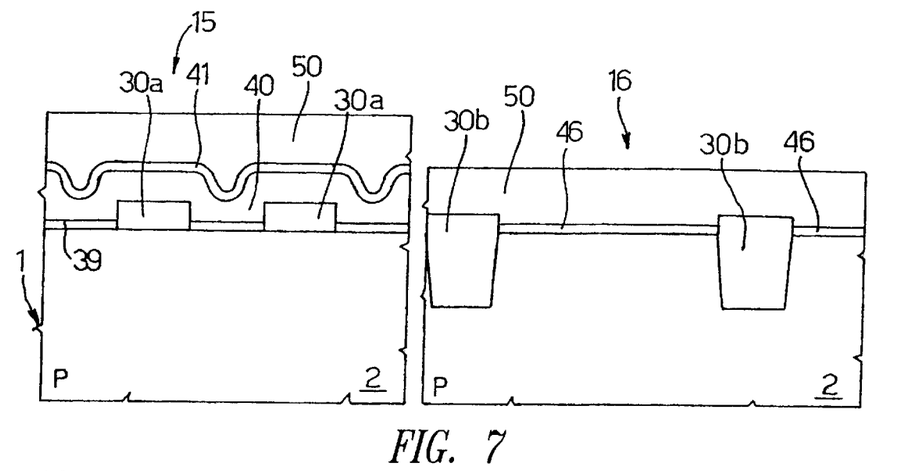

Next, the mask 45 is removed from the matrix area (FIG. 6), and a gate oxide layer 46 is subsequently grown on the circuitry area 16, while the matrix area 15 is protected by the interpoly dielectric layer 41. A second polysilicon layer (poly2 layer 50) is deposited, which is to form the control gate regions of the memory cells (FIG. 7).

Optionally, the wafer 1 may be planarized again using the CMP technique to obtain a planar profile of the surface of the poly2 layer 50. At the end, a small difference of level exists between the top surface of the poly2 layer 50 in the matrix area 15 and the top surface of the poly2 layer 50 in the circuitry area 16.

Figure 8:
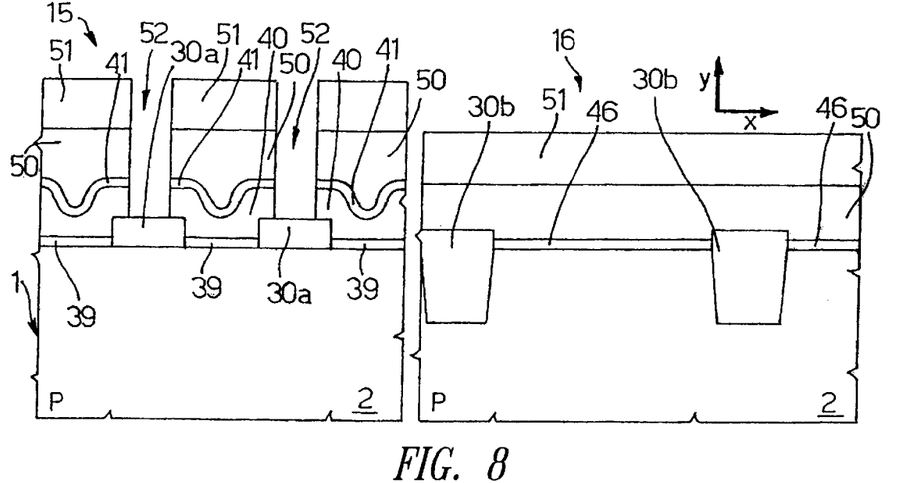
Figure 9:
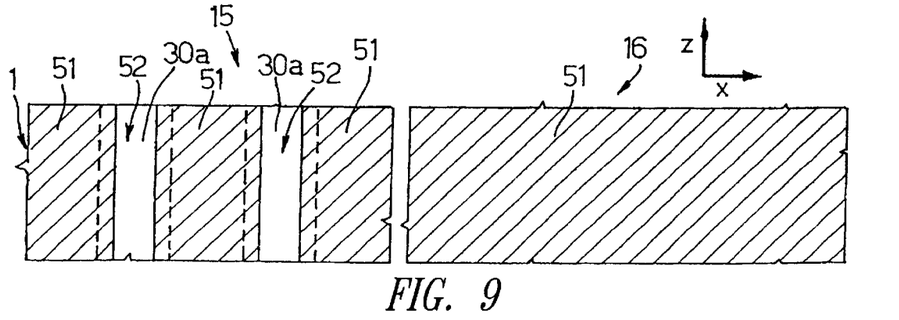
FIG. 9 shows a top view of the wafer of FIG. 8.

Subsequently (FIG. 8), a first gate mask 51 is formed and covers the entire circuitry area 16 and, in the matrix area 15, defines first strips perpendicular to the sectional plane of FIG. 8. Using the first gate mask 51, the poly2 layer 50, the interpoly dielectric layer 41, and the poly1 layer 40 are etched and removed on top of the first oxide regions 30a so as to form centered elongated openings 52 having a smaller width than the field oxide regions 30a, as shown in FIG. 9, where the edges of the field oxide regions 30a are indicated by dashed lines. The stack of layers 50, 41, and 40 is thus defined in one first direction (x direction).

Figure 10:
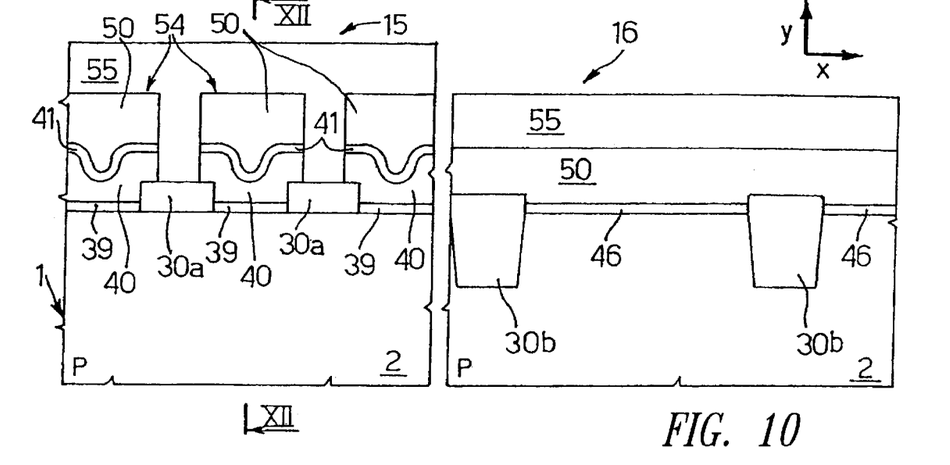
FIG. 10 shows a cross-section similar to that of FIG. 8, in a subsequent manufacturing step.
Figure 11:
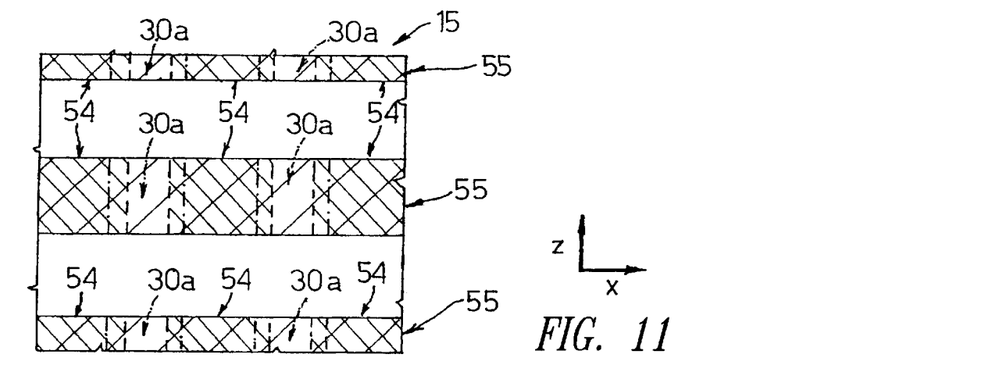
FIG. 11 presents a top view of one part of the wafer of FIG. 10.

Next (FIGS. 10–12) a second gate mask 55 is formed and covers the entire circuitry area 16 and, in the matrix area 15, defines second strips parallel to the sectional plane of FIG. 10 (see in particular FIG. 11). Subsequently, the stacks comprising poly2 layer 50, interpoly dielectric layer 41, poly1 layer 40, and tunnel oxide layer 39, as well as field oxide regions 30a, where these are not covered by the second gate mask 55, are etched and removed. The strips formed by layers 50, 41, 40 in the matrix area 15 are thus defined in a second direction (z direction) perpendicular to the first direction, thus forming stacks 54, each comprising a control gate region 50a, an interpoly dielectric region 41a, and a floating gate region 40a. The resulting structure in this step is shown in FIG. 11, where the solid lines indicate the edges of the regions of the second gate mask 55 (highlighted by hatching with positive slope), the dashed lines indicate the edges of the stacks 54 in the z direction (the stacks being highlighted by hatching with negative slope), and the dashed-and-dotted lines indicate the first field oxide regions 30a.

Figure 12:
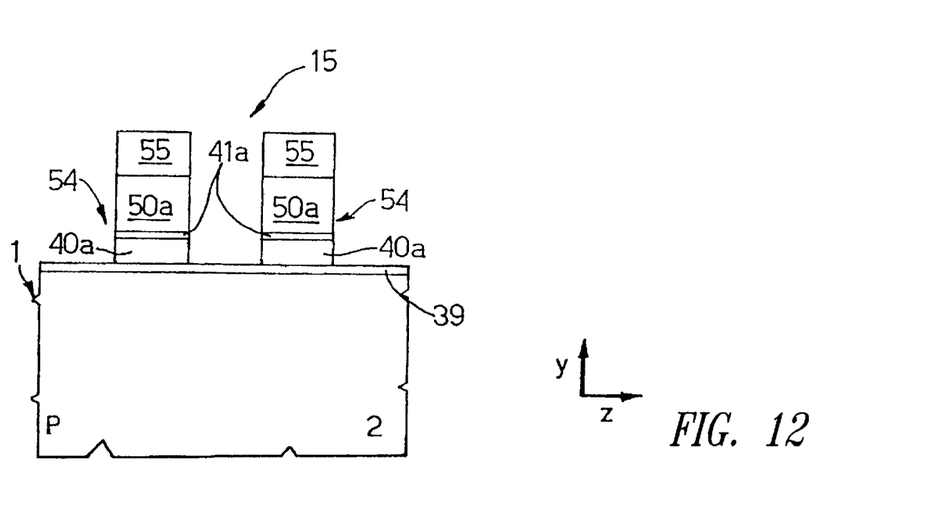
FIG. 12 shows a cross-sectional view of the wafer, taken along plane XII—XII of FIG. 10, in a subsequent manufacturing step.

Consequently, according to one aspect of the present invention, and as is evident from a comparison between FIGS. 10 and 12, the control gate regions 50a are delimited on all four sides along the directions x and z and are separate from the control gate regions 50a of the adjacent memory cells.

Figure 13:
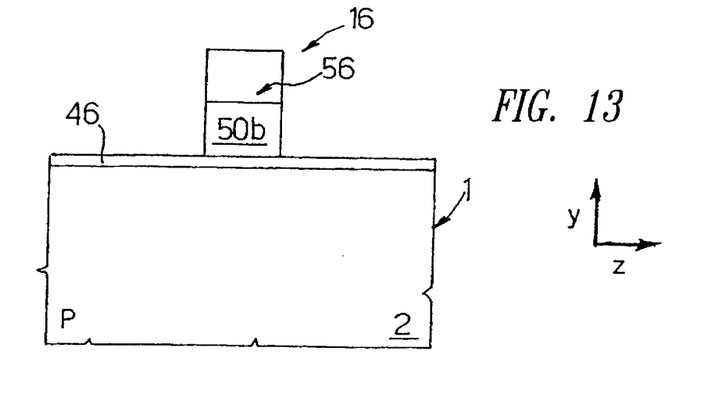
FIG. 13 shows a cross-section similar to that of FIG. 12, taken along a different portion of the electronic device, in a subsequent manufacturing step.

Subsequently (FIG. 13), using a third gate mask 56 that covers the matrix area 15 completely (in a way not shown), as well as the portions of the poly2 layer 50 where the gate regions of the circuitry transistors are to be formed, the poly2 layer 50 is etched in the circuitry area 16. Consequently, the structure of FIG. 13 is obtained, showing the circuitry area 16 where only one gate region 50b of a circuitry transistor is visible.

Figure 14:
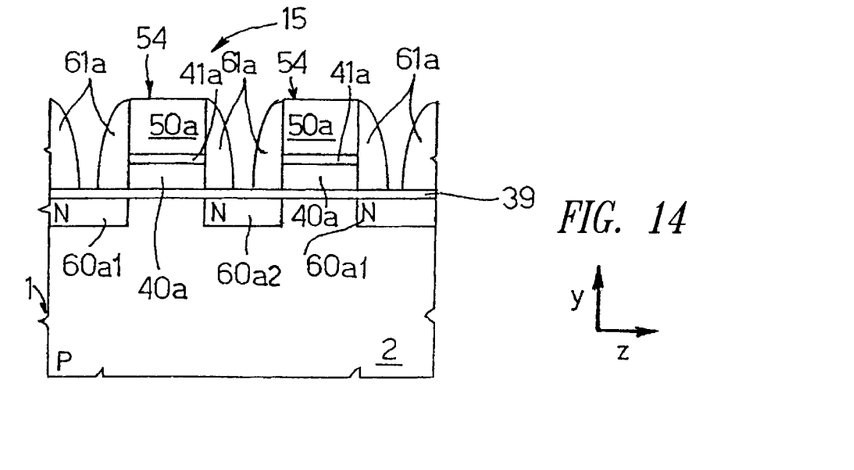
FIG. 14 shows a cross-section similar to that of FIG. 12, in a subsequent manufacturing step.

Next, the circuitry area 16 is masked, and the matrix area 15 is implanted by doping ionic species, in this case of the N type (S/D implant), in a known manner which, consequently, is not illustrated. Inside the substrate 2, on the two opposite sides of the stacks 54 where the first field oxide regions 30a are not present, N-type source regions 60a1 drain regions 60a2 are formed (FIG. 14). Likewise, subsequently N-type and/or P-type doping ionic species are implanted in circuitry area 16 using a mask, so as to form LDD regions 60b, which are of the N-type in the example illustrated in FIG. 15.

Figure 15:
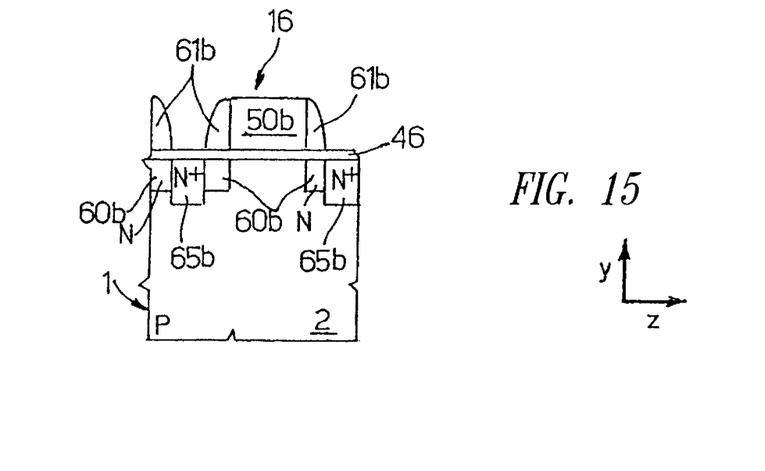
FIG. 15 shows a cross-section similar to that of FIG. 13, in a subsequent manufacturing step.

Next, a dielectric layer is deposited (for example TEOS—tetraethylorthosilicate). In a per se known manner, the TEOS layer undergoes an anisotropic etching, is removed completely from the horizontal portions and remains on the sides of the stacks 54 and of the gate regions 50b where it forms spacers 61a and 61b, respectively (FIGS. 14 and 15).

Subsequently (FIG. 15), N-type and/or P-type doping ionic species are implanted in the circuitry area 16 using a mask to form source and drain regions 65b of the N$^+$ type and/or P$^+$ type, and thus more doped than the LDD regions 60b aligned to the spacers 61b.

Then a metallic silicide layer is formed (the metal typically being titanium, but also cobalt or any other transition metal) by depositing a metal layer over the entire surface of the wafer 1 and performing a heat treatment which causes the metal layer to react with the silicon (silicidation step). Subsequently, the non-reacted metal layer (for example the layer deposited on oxide regions) is etched away using an appropriate solution that leaves the metal silicide intact.

Figure 16:
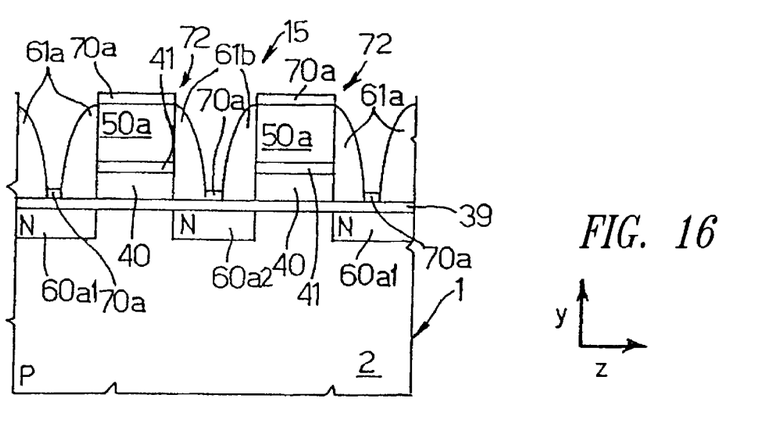
FIG. 16 shows a cross-section similar to that of FIG. 14, in a subsequent manufacturing step.
Figure 17:
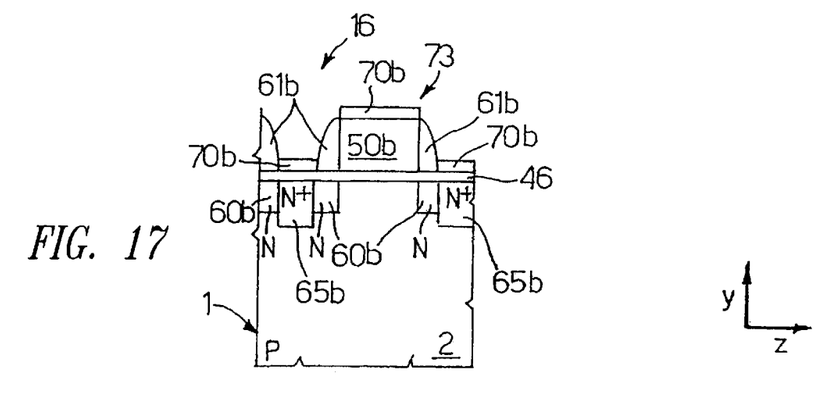
FIG. 17 shows a cross-section similar to that of FIG. 15, in a subsequent manufacturing step.

Silicidation causes the formation of silicide regions 70a in the matrix area 15 and 70b in the circuitry area 16, on top of the source and drain regions 65a, 65b and on top of the control gate regions 50a and gate regions 50b, as shown in FIGS. 16 and 17, wherein the memory cells thus obtained are designated by 72, and the circuitry transistor is designated by 73.

Figure 18:
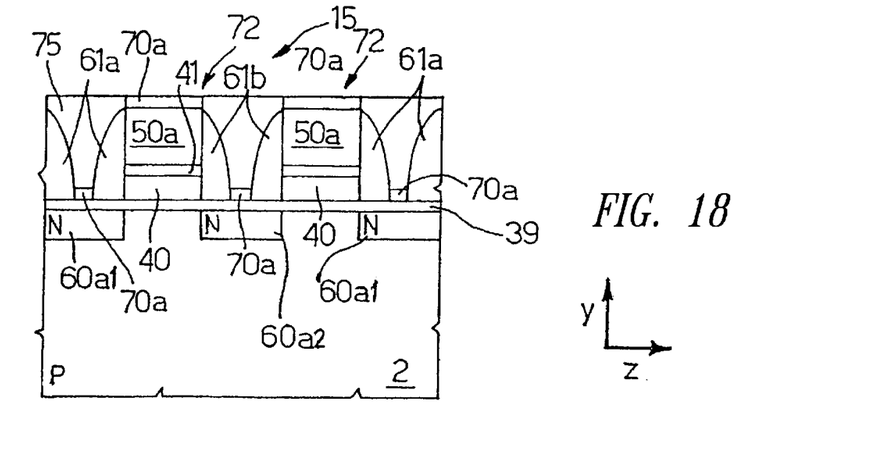
FIG. 18 shows a cross-section similar to that of FIG. 16, in a subsequent manufacturing step.
Figure 19:
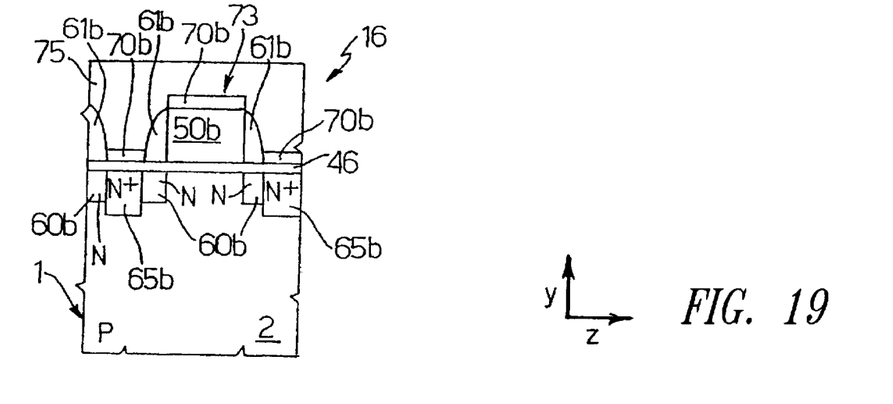
FIG. 19 shows a cross-section similar to that of FIG. 17, in a subsequent manufacturing step.

Then a protective layer 75 of dielectric material (or a number of dielectric material layers) is deposited, for example boron phosphorus silicon glass (BPSG), as shown in FIG. 18 for the matrix area 15 and in FIG. 19 for the circuitry area 16. The protective layer 75 covers the memory cells 72 completely in the matrix area 15 and the transistors 73 in the circuitry area 16. Then the structure is planarized, for example using the CMP technique. In particular, planarization is carried on as far as the silicide regions 70a on top of the control gate regions 50a of the memory cells 72 in the matrix area 15. Consequently, in the matrix area 15 the protective layer 75 remains only between the memory cells 72 (FIG. 18). Because of the small height difference between the control gate regions 50a (and the corresponding silicide regions 70a) and the gate regions 50b (and the corresponding silicide regions 70b), in the circuitry area 16 the protective layer 75 remains also slightly above the gate regions 50b (FIG. 19).

Figure 20:
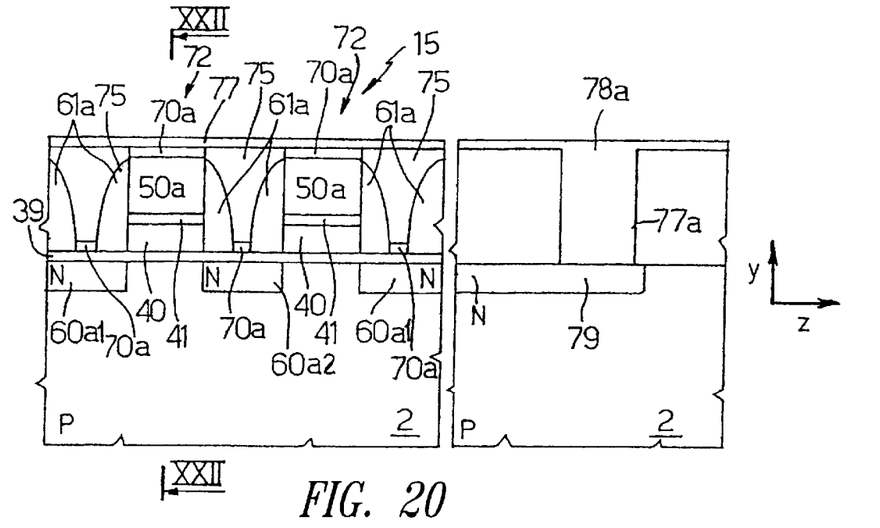
FIG. 20 shows a cross-section similar to that of FIG. 18, in a subsequent manufacturing step.
Figure 21:
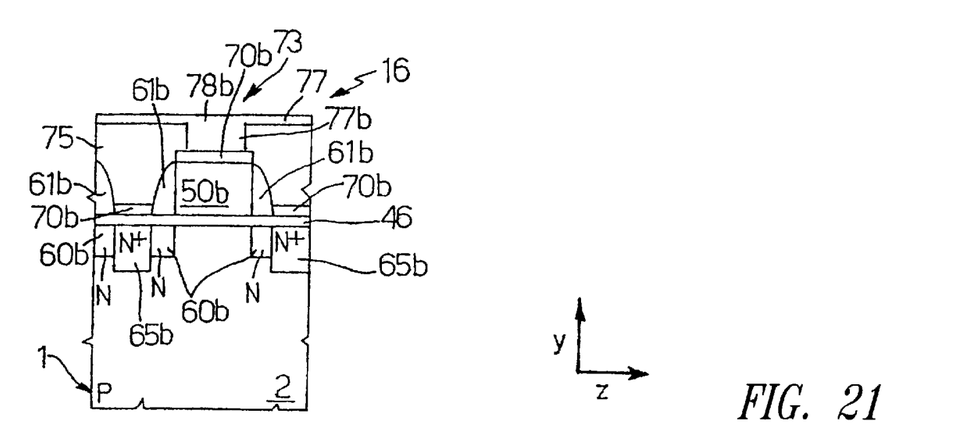
FIG. 21 shows a cross-section similar to that of FIG. 19, in a subsequent manufacturing step.

Finally, the contacts are formed. To this end, initially openings are formed in the protective layer 75. Then (FIG. 20), a tungsten layer 77 is deposited having a thickness of approximately 800–1500 nm, using the known W-plug technology. FIG. 20 shows, just to provide an example, an opening 78a extending throughout the thickness of the protective layer 75 as far as the surface of the substrate 2. The opening 78 is filled by the tungsten layer 77 so as to form a contact 77a for an N-type conductive region 79 formed in the substrate 2 and belonging to an electronic component (not shown). Likewise, as illustrated in FIG. 21, above the gate regions 50b, in the circuitry area 16, openings 78b are formed that reach the silicide regions 70b on top of the gate regions 50b. The openings 78b are filled with the tungsten layer 77 so as to form contacts 77b for the gate regions 50b.

A first interconnection level is then defined and exploits the tungsten layer 77 as if it were an aluminum standard metal layer. In particular, using a mask (not shown), selective portions of the tungsten layer 77 are removed on top of the protective layer 75. In the matrix area 15 word lines 80a are then formed perpendicular to the section plane of FIG. 22, also visible in the top view of FIG. 23, so as to connect together the control gate regions 50a of the memory cells 72 aligned on a same column (z direction in FIG. 23). In this step, interconnection regions are moreover formed between the various components of the device, in particular between the matrix area 15 and the circuitry area 16 and between the transistors 73 (as well as between the other components, not shown, of the circuitry area 16).

Figure 22:
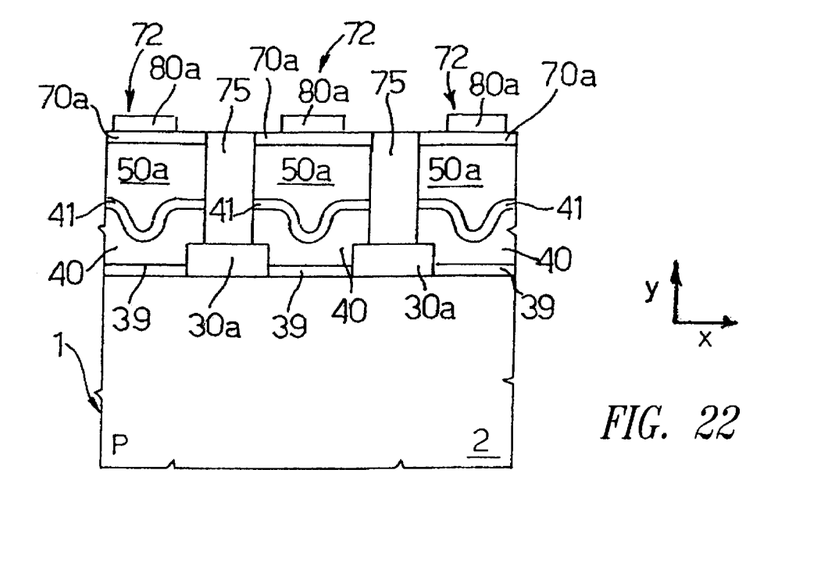
FIG. 22 shows a cross-section taken along plane XXII—XXII of FIG. 20, in a subsequent manufacturing step.
Figure 23:
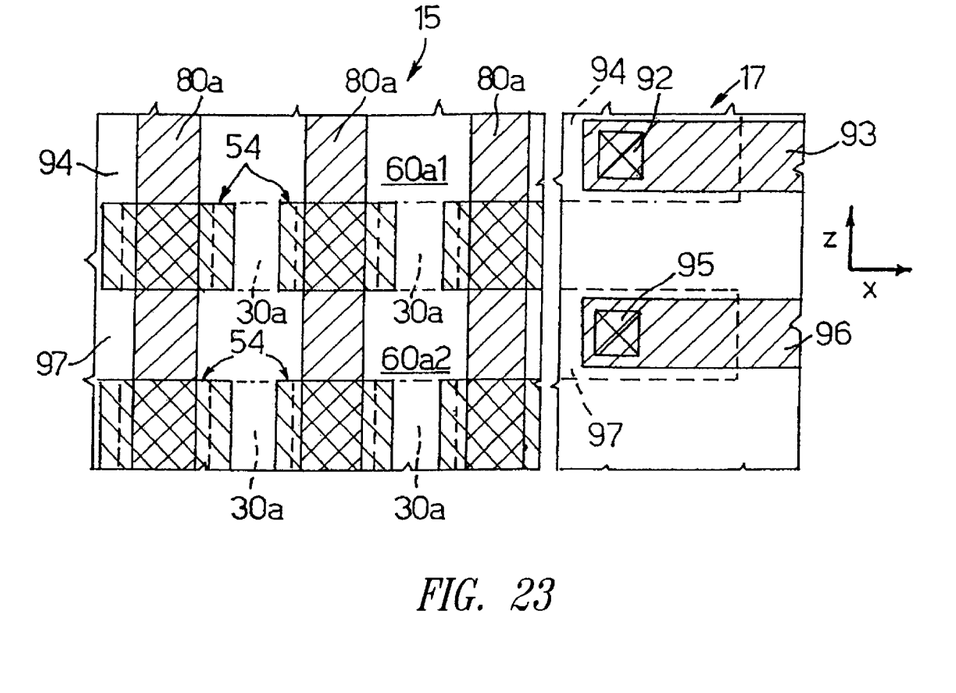
FIG. 23 shows a top view of the wafer of FIG. 22.
Figure 24:
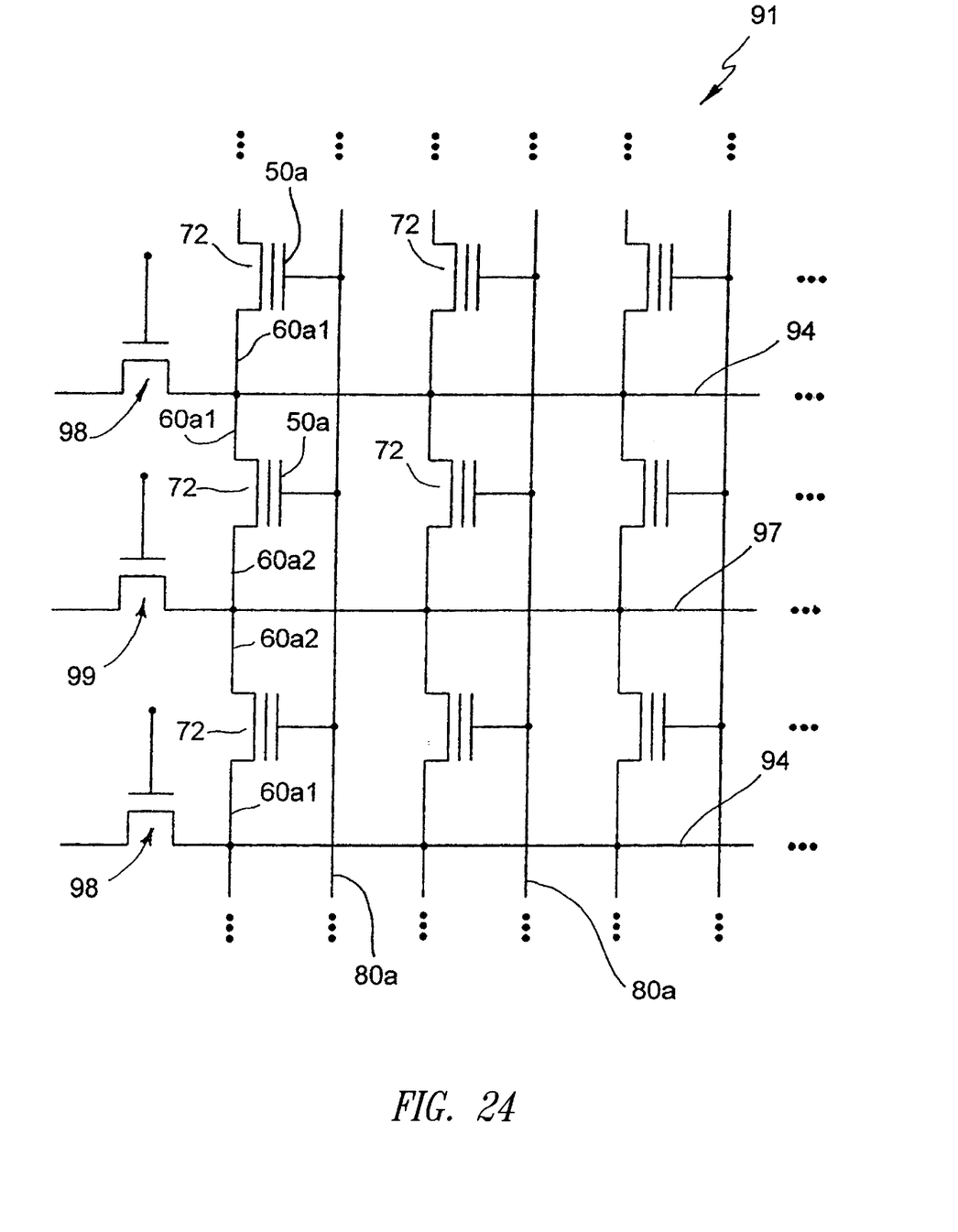
FIG. 24 shows an equivalent electrical circuit of a memory device according to the present invention.

The final structure of the matrix area 15 may be seen in FIGS. 22 and 23 and is shown schematically in FIG. 24, which illustrates an array memory 91 comprising a plurality of cells 72 arranged in rows and columns. In detail, the control gate regions 50a of the memory cells 72 set vertically aligned (in a same column) are connected together by a respective word line 80a. The source regions 60a1 of the cells 72 comprise diffused source lines 94 extending within the substrate 2 and connected at one end to source contacts 92, which in turn are connected to a source metal line 93. The drain regions 60a2 of the cells 72 comprise diffused drain regions 97 (defining bit lines) extending within the substrate 2 and connected at one end to source contacts 95, which in turn are connected to drain metal lines 96. The source contacts 92 and drain contacts 95 are formed in an area 17 of the substrate 2 external to the matrix area 15. The source contacts 92 and drain contacts 95, as well as the source metal line 93 and drain metal lines 96, are altogether analogous to the contact 77a of FIG. 20. Finally, FIG. 24 shows selection transistors 98 and 99 connected to the source metal line 93 and, respectively, to the drain metal lines 96.

The described method provides a reduction in the dimensions of the memory cells because, as in the case of AMG cells, it is possible to form source contacts 92 and drain contacts 95 outside the matrix area 15, where the memory cells 72 are formed (area 17). In addition, the fact that the control gate regions 50a are completely separate from the control gate regions 50a of the adjacent cells in both directions by the protective layer 75, and that the word lines 80a comprise planar strips made of metallic material set apart from the substrate 2 by a distance equal to the height of the stacks 54 avoids the problems existing in AMG cells.

Furthermore, the process according to the invention reduces the dimensions of the memory matrix in a direction perpendicular to the word lines 80a. In fact, the use of a deposited field oxide, instead of a thermally grown field oxide, eliminates the presence of inclined oxide regions, usually referred to as birds beaks. In addition, since the diffused source lines 94 and diffused drain lines 97 are defined when etching poly2 layer 50, interpoly dielectric layer 41, poly1 layer 40, and tunnel oxide layer 39, as well as field oxide regions 30a, enables a more precise implantation as compared to known solutions.

Finally, it is clear that numerous modifications and variations can be made to the method and to the electronic device described and illustrated herein, all of which falling within the scope of the invention, as defined in the attached claims. For example, it is possible to implant the source/drain in the matrix area 15 before defining the gate regions of the transistors 73 in the circuitry area 16, exploiting the second gate mask 55 which covers the circuitry area 16. Furthermore, the silicidation step is optional. Finally, the sacrificial oxide 38 may be absent; in this case, the substrate 2 is protected during the threshold implantation step by the portion of the oxide layer 8 that remains after etching the nitride layer 12.

In addition, the contacts and interconnection lines may be formed using the so-called "damascene" technique, according to which, after depositing the protection layer 75, a stop layer, for example of silicon nitride, and then a further dielectric layer are deposited. With a second mask, the further dielectric layer is then etched. The etch terminates on the stop layer. Subsequently, using an appropriate mask, openings are formed in the protective layer 75, and then a tungsten layer is deposited having a thickness of approximately 800–1500 nm, using the known W-plug technology. Subsequently, the structure may be planarized to eliminate the excess tungsten.

Finally, the same process may be used to manufacture a different memory type, as mentioned previously. As regards flash memories and EPROM memories, the present process is particularly advantageous for technologies enabling body erasing, where the source region no longer requires a double implant and is formed during the drain implant, thus rendering the memory cells symmetrical. In the case of EEPROM memories, the process must of course be adapted so as to form selection transistors at the same time as memory transistors of the stacked type.

What is claimed is:

1. An electronic device comprising:
   a substrate of semiconductor material;
   memory cells, each including a stack on top of said substrate; each of said stacks comprising a floating gate region of semiconductor material, an intermediate dielectric region, and a control gate region of semiconductor material; and
   a protective layer extending on top of said substrate and between said stack structures, said protective layer having a height at least equal to that of said stack structures; and
   word lines of conductive material extending on top of said insulating material layer;
   said control gate region is physically separated from control gate regions belonging to adjacent stack structures by said protective layer;
   and said word lines extend on top of said control gate regions and are in electrical contact with said control gate regions.

2. The device of claim 1, comprising interconnection lines of metal, and said word lines comprise metal regions coplanar with said interconnection lines.

3. The device of claim 2, wherein said interconnection lines and said word lines are formed of tungsten.

4. The device of claim 1, wherein said stack structures extend on top of a first portion of said substrate and the device comprises diffused source and drain lines extending parallel to and alternating with one another, at a distance, in said substrate between rows of said stack structures, said diffused source and drain lines having one end that extends in a second portion of said substrate that is remote from said first portion and being electrically connected to source and drain contacts.

5. The device of claim 1, comprising first insulating regions and second insulating regions in a first area and, respectively, in a second area, separate from said first area, of a substrate of semiconductor material, wherein said first insulating regions are formed on top of said substrate and have a first height, and said second insulating regions are formed in trenches extending within said substrate and protrude from said trenches at a second height smaller than said first height.

* * * * *